United States Patent
Liao

(10) Patent No.: US 6,884,033 B2
(45) Date of Patent: Apr. 26, 2005

(54) VOLUTE INLET OF FAN

(75) Inventor: Denni Liao, Hsinchu (TW)

(73) Assignee: Cheng Home Electronics Co., Ltd., Hsinchu (TW)

( * ) Notice: Subject to any disclaimer, the term of this patent is extended or adjusted under 35 U.S.C. 154(b) by 0 days.

(21) Appl. No.: 10/671,506

(22) Filed: Sep. 29, 2003

(65) Prior Publication Data

US 2005/0069410 A1   Mar. 31, 2005

(51) Int. Cl.[7] ............................................. F04D 29/42
(52) U.S. Cl. ................ 415/206; 415/182.1; 415/208.1
(58) Field of Search ............................ 415/175–178, 415/203, 204, 206, 208.1, 182.1, 213.1, 214.1; 361/695–697

(56) References Cited

U.S. PATENT DOCUMENTS

| | | | | |
|---|---|---|---|---|
| 801,304 A | * | 10/1905 | Davidson | .................... 415/204 |
| 820,399 A | * | 5/1906 | Davidson | .................... 415/204 |
| 3,407,995 A | * | 10/1968 | Kinsworthy | ................ 415/206 |
| 3,824,028 A | * | 7/1974 | Zenkner et al. | ............. 415/206 |
| 5,504,650 A | * | 4/1996 | Katsui et al. | ............... 361/697 |
| 5,813,834 A | * | 9/1998 | Hopfensperger et al. | ... 415/206 |
| 2004/0123978 A1 | * | 7/2004 | Hashimoto et al. | ......... 361/695 |

FOREIGN PATENT DOCUMENTS

| | | | |
|---|---|---|---|
| JP | 55-69799 A | * | 5/1980 |
| JP | 5-149297 A | * | 6/1993 |
| JP | 9-126193 A | * | 5/1997 |

* cited by examiner

*Primary Examiner*—Christopher Verdier
(74) *Attorney, Agent, or Firm*—Birch, Stewart, Kolasch & Birch, LLP

(57) ABSTRACT

The fan has a volute inlet. Designing the shape of inlet to improve the heat dissipation of the fan. The fan has a volute inlet having a reference point on the housing with respect to an outlet. The blades are partially covered by the inlet from the reference point wherein an area of the blades covered by the inlet is from a maximum to a minimum gradually in a closed loop. As a result, the set up current of air can reach a maximum prior to output from the outlet, thereby increasing the heat dissipation capability of the fan.

20 Claims, 7 Drawing Sheets

VOLUTE INLET OF FAN

FIELD OF THE INVENTION

The present invention relates to cooling devices and more particularly to a volute inlet of a fan with an improved heat dissipation characteristic.

DESCRIPTION OF RELATED ART

The improvements of computer components are continuous. Also, heat generated by running computer components is increased. This is particularly true for a CPU (central processing unit) and data storage components (e.g., hard disk). It is understood that the normal operation of a computer will be adversely affected or even the computer will be broken down if accumulated heat is not dissipated sufficiently. As such, well heat dissipation is critical for the computers. A heat dissipation device for a computer is either a liquid cooled or an air cooled type. Also, a fan is the most important element of the heat dissipation device of either type. This is particularly true for the notebook computer or the 1U server. However, the increase of the number of fans is limited or even impossible due to the narrow internal space of the computer or the 1U server. Hence, the only way to increase the heat dissipation capability of a computer is to increase the efficiency of the fan.

A prior eccentric fan disclosed an inlet and blades at positions other than center thereof. It is known that introduced air will cause turbulence due to collision with three sidewalls (other than inlet) of the housing of fan. This will decrease the speed of the set-up air current and thus will decrease efficiency. As such, the above eccentric configuration aims at decreasing the turbulence and thus increases the efficiency of the fan.

However, the prior eccentric design requires a larger space for accommodating components of the fan. This contradicts the trend of downsizing of modern electrical and/or electronic products. The space between the blades of the fan and the three sidewalls of the housing is from the maximum to the minimum, but an area of the inlet is equal to an area of the blades. Moreover, turbulence still cannot be completely eliminated due to the collision of the set up current of the air with sidewalls of the housing. As a result, the purpose of increasing the heat dissipation capability of a fan is not achieved. Thus, the need for improvement still exists.

SUMMARY OF THE INVENTION

It is an object of the present invention to provide a fan for cooling an electronic device without modifying a housing of the fan. Instead, the fan is designed to have a volute inlet rather than a circular one to partially cover blades by adapting to the direction of the introduced air. The inlet has a reference point on the housing with respect to an outlet. The blades are partially covered by the inlet from the reference point wherein an area of the blades covered by the inlet is from a maximum to a minimum gradually in a closed loop. As a result, the set-up air current can reach a maximum prior to output from the outlet, thereby increasing the beat dissipation capability of the fan. The above and other objects, features and advantages of the present invention will become apparent from the following detailed description taken with the accompanying drawings.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
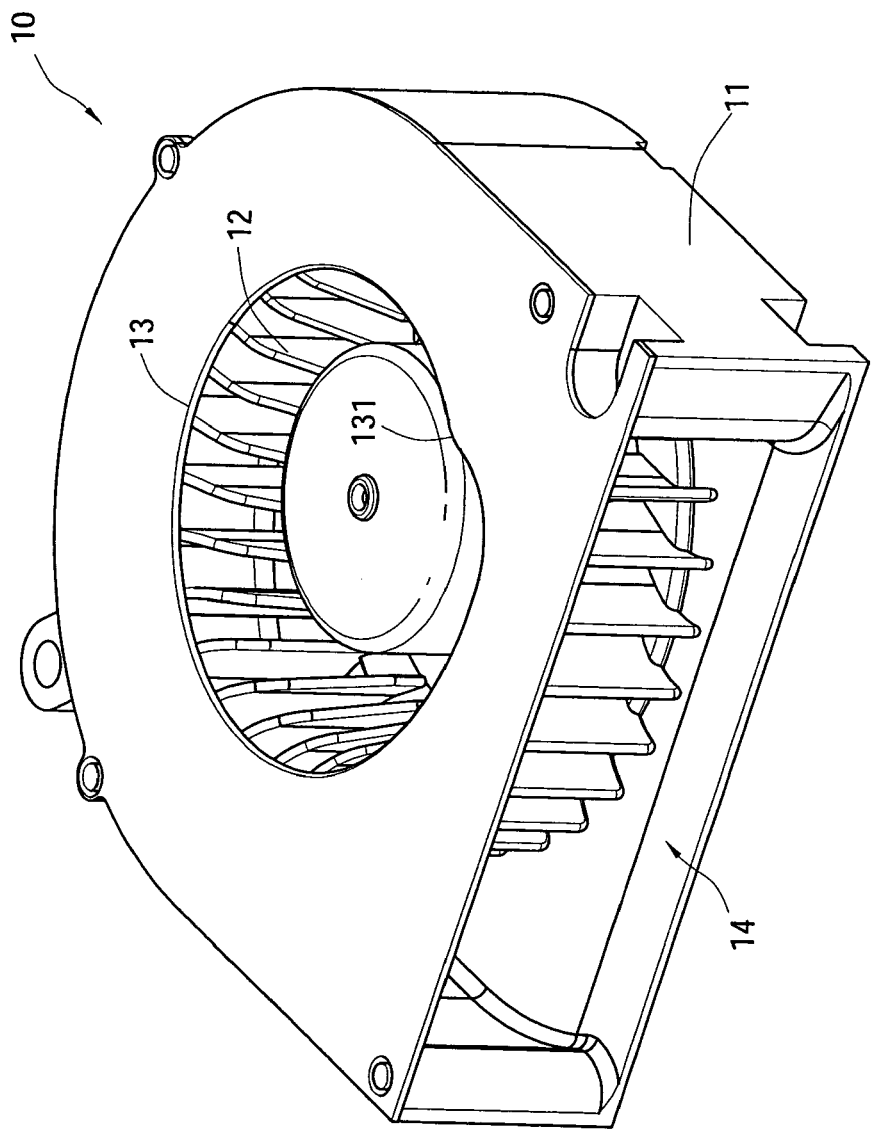
FIG. 1 is a perspective view of a first preferred embodiment of a fan incorporating a volute inlet according to the invention.
Figure 2:
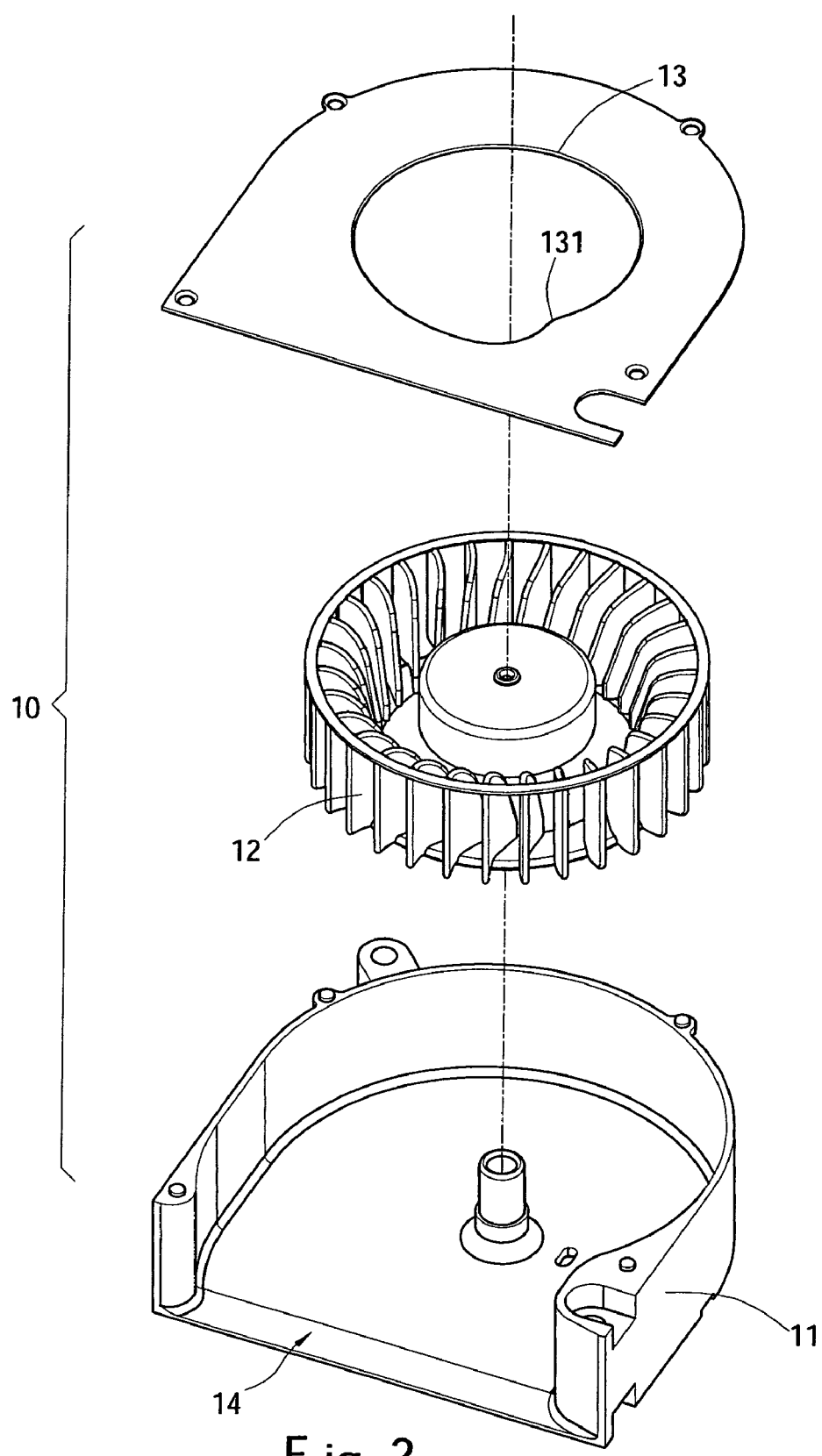
FIG. 2 is an exploded view of FIG. 1.

Referring to FIGS. 1 and 2, a first preferred embodiment of fan 10 is shown in accordance with the invention. The fan 10 has an improved inlet 13 for increasing heat dissipation capability thereof as detailed below. The inlet has a shape started from a reference point 131 with respect to an outlet 14. Blades 12 are partially covered by the inlet 13 from the reference point 131 in which the covered area of blades is from a maximum to a minimum gradually in a closed loop. This forms a volute inlet rather than a circular inlet 13.

Figure 3:
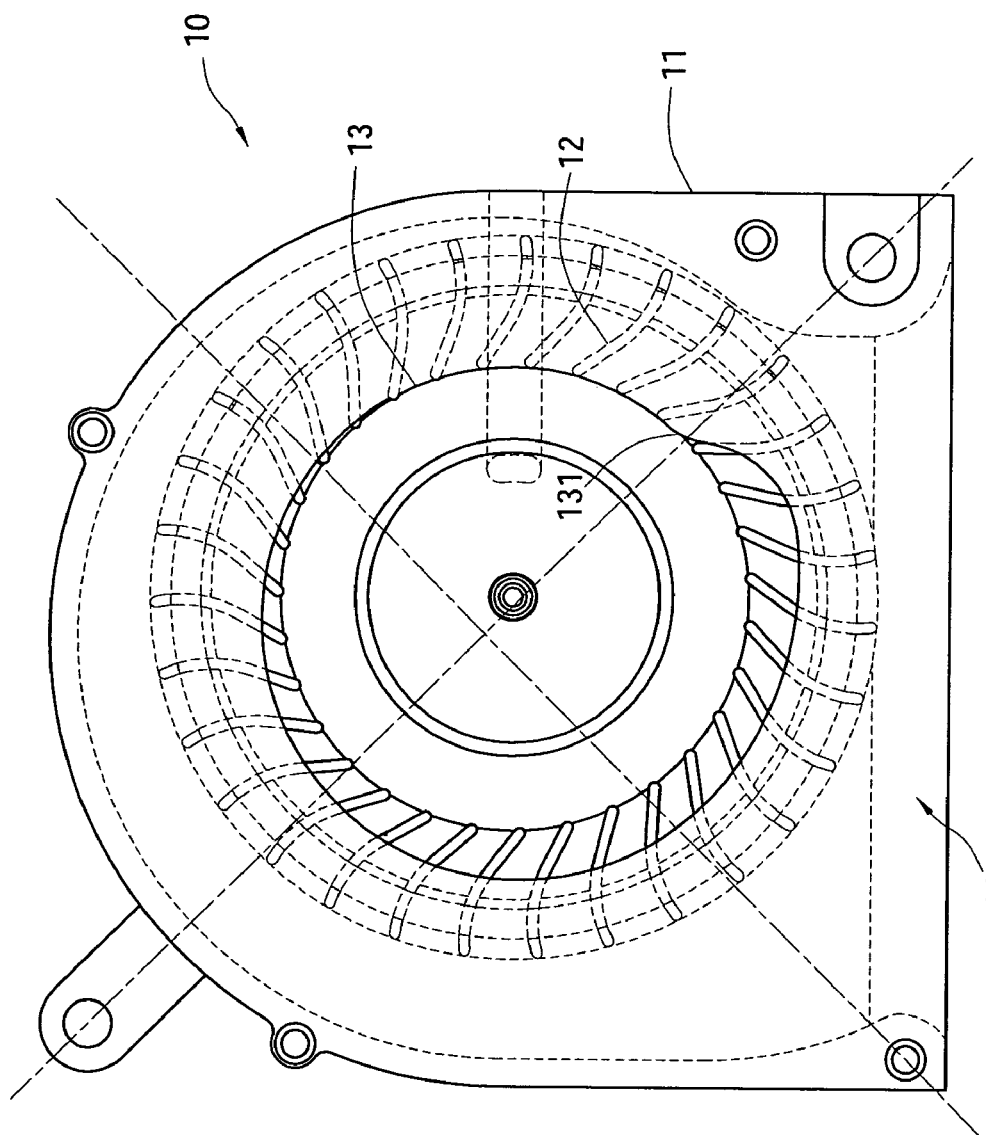
FIG. 3 is a top plan view of FIG. 1.
Figure 7:
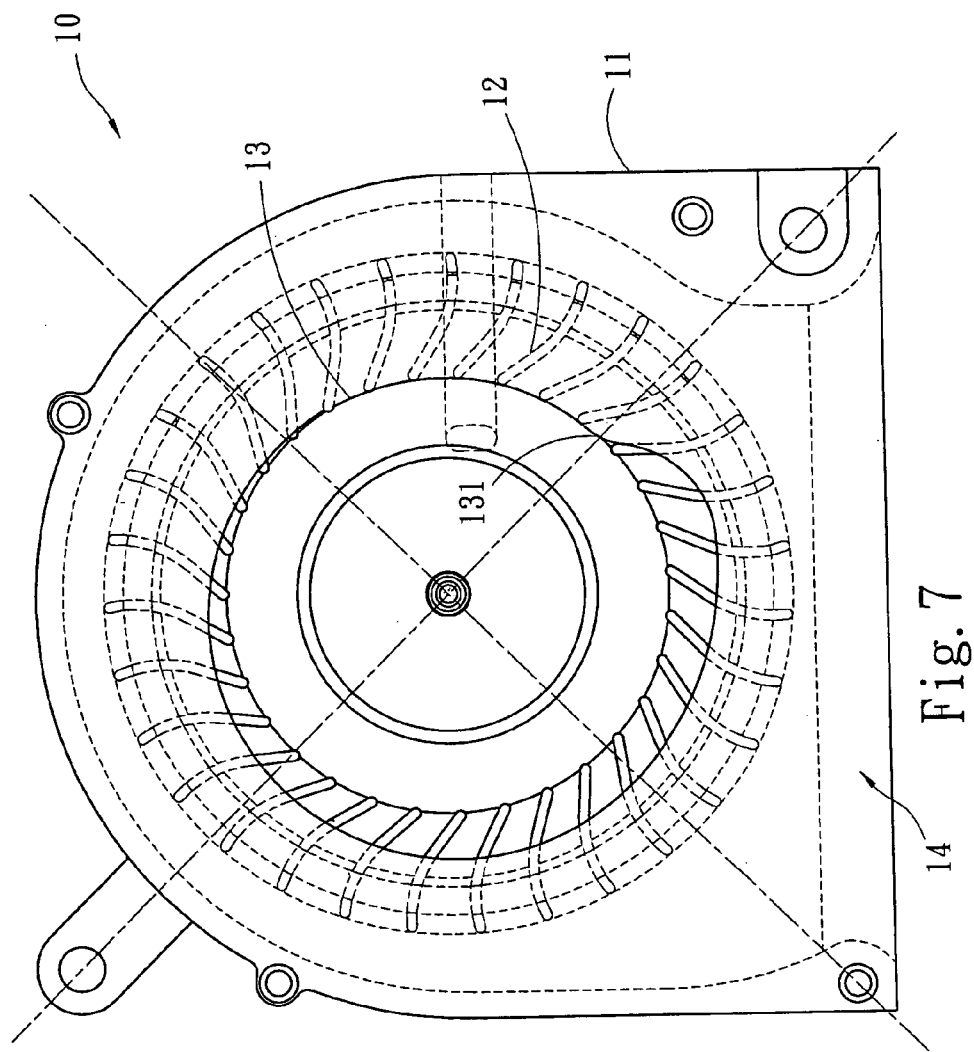
FIG. 7 is a top plan view similar to FIG. 3 but showing a concentric outlet.

The fan 10 is implemented as a centrifugal fan and comprises a housing 11, a plurality of blades 12 rotatably supported by a shaft, an inlet 13 on two sides of the hosuing 11, and a side outlet 14. The inlet 13 is either concentric, as shown in FIG. 7, or eccentric, as shown in FIG. 3, with respect to the housing 11. Also, the shaft of the blades 12 is located at a center of the inlet 13.

Referring to FIG. 3, the inlet 13 is substantially divided into four quarters. The first quarter begins at the reference point 131 in which an area of the blades 12 covered by the first quarter of the inlet 13 is a maximum as indicated by dashed lines. As such, the amount of introduced air per unit time will be decreased and thus the air compression ratio will be increased. Consequently, in the second quarter the amount of introduced air per unit time will be increased slightly as the area of the blades 12 covered by the second quarter is decreased. As such, the air current will be further compressed. In the third quarter, more air is introduced into the housing 11 and thus the air current will be still further compressed. In the fourth quarter, the covered area of the blades 12 is a minimum and the set-up air current reaches a maximum prior to output from the outlet 14. As a result, a component facing the outlet 14 will be sufficiently cooled.

Note that a reverse air current will be generated if the component is very close to the outlet 14. Also, a reverse air current will be also generated if the suction effect in the third quarter is large enough due to the quick expansion of low pressure air. Advantageously, the invention can overcome the above adverse factors. Moreover, the volute shape of the inlet 13 can increase the set-up air current by increasing a pressure difference between the inlet 13 and the outlet 14. Thus, more driving power is transmitted to the shaft. This in turn will increase the efficiency of the fan 10 by increasing the heat dissipation capability thereof. In addition, noise generated during operation can be significantly reduced.

Figure 4:
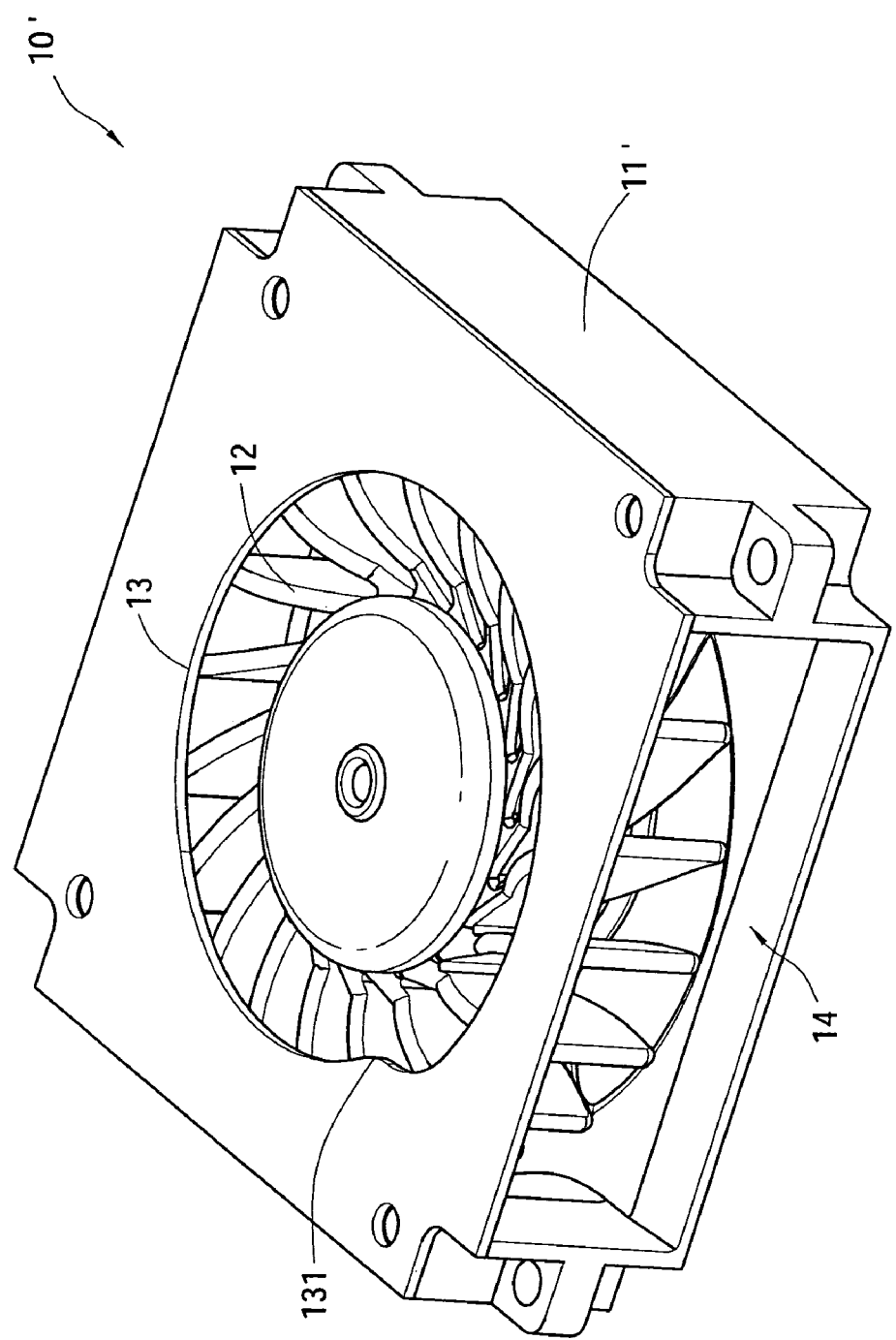
FIG. 4 is a perspective view of a second preferred embodiment of a fan incorporating a volute inlet according to the invention.
Figure 5:
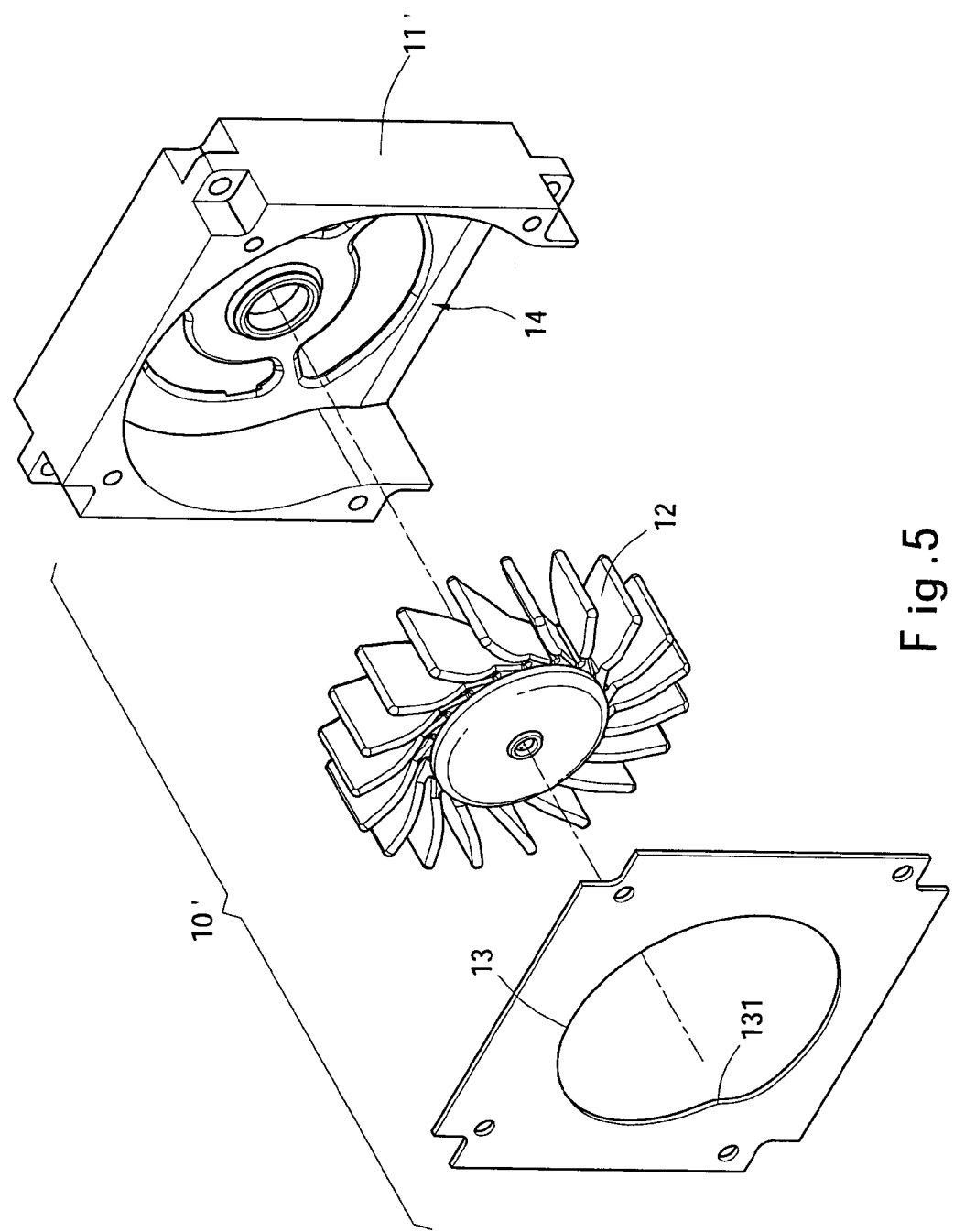
FIG. 5 is an exploded view of FIG. 4.
Figure 6:
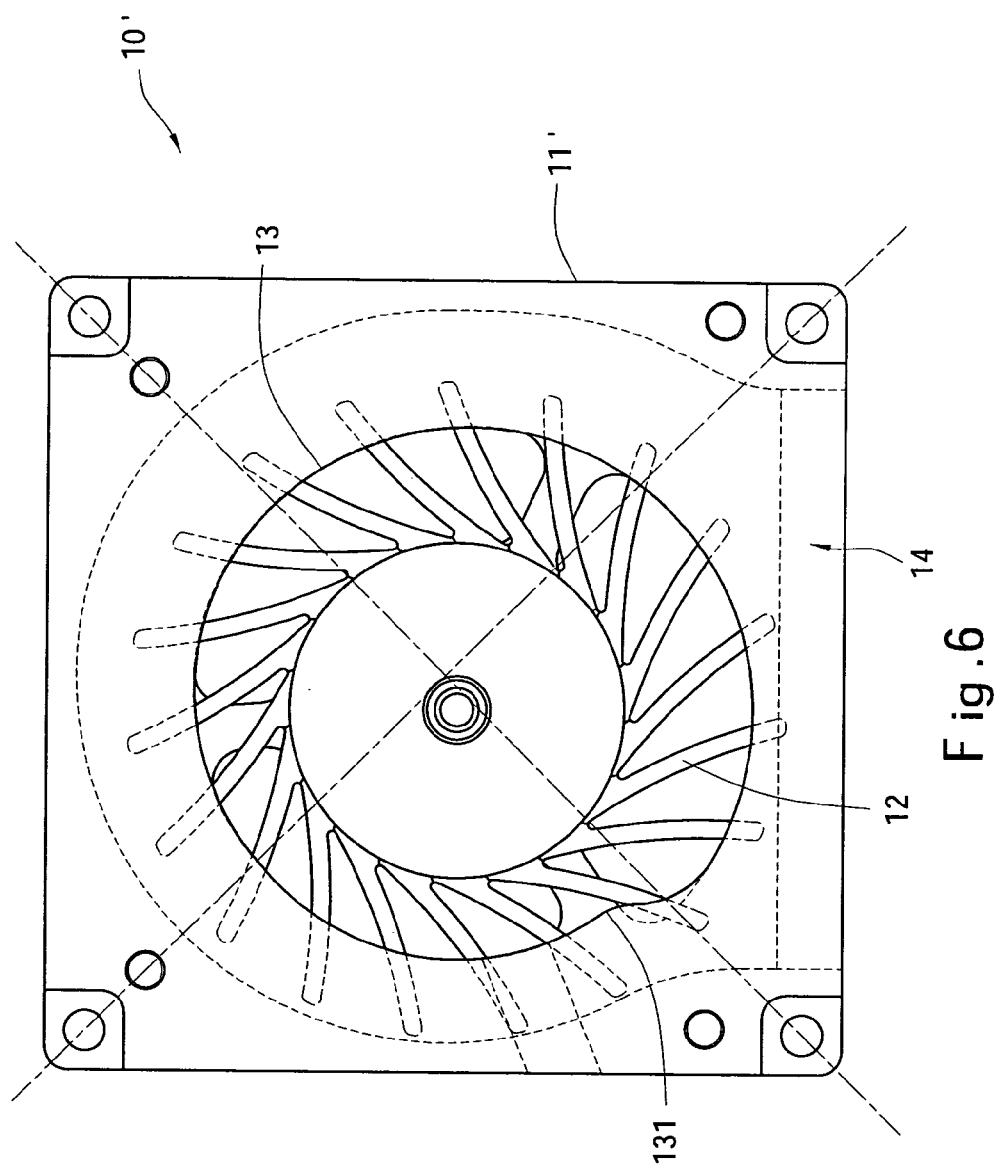
FIG. 6 is a top plan view of FIG. 4.

Referring to FIGS. 4 to 6, a second preferred embodiment of fan 10' is shown in accordance with the invention. The second preferred embodiment substantially has same structure as the first preferred embodiment. The only difference between the first and the second preferred embodiments is that the housing 11' has a shape different from the housing 11. The second preferred embodiment aims at accommodating the fan of the invention to different interior space of an electronic device.

While the invention herein disclosed has been described by means of specific embodiments, numerous modifications and variations could be made thereto by those skilled in the art without departing from the scope and spirit of the invention set forth in the claims.

What is claimed is:

1. A fan for cooling an electronic device, comprising:
a plurality of blades rotatably supported by an axis;
an outlet; and
an inlet having a non-circular circumference starting from a first reference point thereof with respect to the outlet, the inlet partially covering the blades, the inlet being in a plane and being non-symmetrical with respect to all axes lying in the plane.

2. The fan of claim 1, wherein the fan is a centrifugal fan.

3. The fan of claim 1, further comprising a housing for mounting the blades therein wherein the housing comprises the inlet being located on the top and the bottom surface thereof and the outlet being located at a side.

4. The fan of claim 3, wherein the inlet is concentric with respect to the housing.

5. The fan of claim 3, wherein the inlet is eccentric with respect to the housing.

6. The fan of claim 1, wherein the inlet has a volute shape.

7. The fan of claim 1, wherein the blades have the same shape and the blades are equally spaced around the axis.

8. The fan of claim 1, wherein an area of the blades covered by the inlet is calculated from outside of the blades to the axis of the blades.

9. The fan of claim 1, wherein the non-circular circumference is a spiral circumference with a first varying radius and a second varying radius with respect to the axis, the first varying radius continuously increasing when measured from the first reference point in a first direction to a second reference point, the second varying radius continuously increasing when measured from the first reference point in a second direction to the second reference point, the first direction being one of clockwise and counterclockwise, the second direction being opposite to the first direction, the first varying radius increasing more slowly than the second varying radius.

10. The fan of claim 9, wherein the inlet maximally covers the blades at the first reference point and minimally covers the blades at the second reference point, the coverage of the blades by the inlet continuously decreasing from the first reference point to the second reference point.

11. The fan of claim 1, wherein the inlet maximally covers the blades at the first reference point and minimally covers the blades at a second reference point, the coverage of the blades by the inlet continuously decreasing from the first reference point to the second reference point in both a first direction and a second direction, the first direction being one of clockwise and counterclockwise, the second direction being opposite to the first direction.

12. A fan for cooling an electronic device, comprising:
a plurality of blades rotatably supported by an axis;
an outlet; and
an inlet having a circumference starting from a first reference point thereof with respect to the outlet, the inlet maximally covering the blades at the first reference point and minimally covering the blades at a second reference point, the coverage of the blades by the inlet continuously decreasing from the first reference point to the second reference point in both a first direction and a second direction, the first direction being one of clockwise and counterclockwise, the second direction being opposite to the first direction.

13. The fan of claim 12, wherein the fan is a centrifugal fan and wherein the inlet is one of concentric and eccentric with respect to a fan housing.

14. The fan of claim 12, wherein the inlet has a volute shape.

15. The fan of claim 12, wherein the blades have the same shape and the blades are equally spaced around the axis.

16. A fan for cooling an electronic device, comprising:
a plurality of blades rotatably supported by an axis;
an outlet; and
an inlet having a spiral circumference starting from a first reference point thereof with respect to the outlet, the spiral circumference having a first varying radius and a second varying radius with respect to the axis, the first varying radius continuously increasing when measured from the first reference point in a first direction to a second reference point, the second varying radius continuously increasing when measured from the first reference point in a second direction to the second reference point, the first direction being one of clockwise and counterclockwise, the second direction being opposite to the first direction, the first varying radius increasing more slowly than the second varying radius.

17. The fan of claim 16, wherein the inlet maximally covers the blades at the first reference point and minimally covers the blades at the second reference point, the coverage of the blades by the inlet continuously decreasing from the first reference point to the second reference point.

18. The fan of claim 16, wherein the fan is a centrifugal fan and wherein the inlet is one of concentric and eccentric with respect to a fan housing.

19. The fan of claim 16, wherein the inlet has a volute shape.

20. The fan of claim 16, wherein the blades have the same shape and the blades are equally spaced around the axis.

* * * * *